(12) United States Patent
Washizu

(10) Patent No.: US 8,373,433 B2
(45) Date of Patent: Feb. 12, 2013

(54) TEST APPARATUS, TEST METHOD AND MANUFACTURING METHOD

(75) Inventor: Nobuei Washizu, Saitama (JP)

(73) Assignee: Advantest Corporation, Tokyo (JP)

( * ) Notice: Subject to any disclaimer, the term of this patent is extended or adjusted under 35 U.S.C. 154(b) by 556 days.

(21) Appl. No.: 12/703,568

(22) Filed: Feb. 10, 2010

(65) Prior Publication Data

US 2010/0207640 A1 Aug. 19, 2010

Related U.S. Application Data

(63) Continuation of application No. PCT/JP2008/064544, filed on Aug. 13, 2008, and a continuation-in-part of application No. PCT/JP2007/066104, filed on Aug. 20, 2007.

(51) Int. Cl.
*G01R 31/02* (2006.01)
(52) U.S. Cl. ............... 324/762.01; 324/537; 714/744; 702/72
(58) Field of Classification Search ............... 324/537, 324/762.01, 622, 76.77; 714/724, 742, 744; 702/117, 125, 72; 365/193, 201
See application file for complete search history.

(56) References Cited

U.S. PATENT DOCUMENTS

| | | | |
|---|---|---|---|
| 5,659,553 A * | 8/1997 | Suzuki | 714/736 |
| 6,693,436 B1 * | 2/2004 | Nelson | 324/537 |
| 6,715,119 B1 | 3/2004 | Watanabe | |
| 7,461,316 B2 * | 12/2008 | Hasegawa et al. | 714/744 |
| 2001/0005132 A1 | 6/2001 | Nishikawa et al. | |
| 2003/0115527 A1 | 6/2003 | Watanabe | |
| 2004/0098649 A1 | 5/2004 | Watanabe | |
| 2005/0204240 A1 | 9/2005 | Watanabe | |
| 2005/0219937 A1 | 10/2005 | Sato | |
| 2005/0259556 A1 | 11/2005 | Doi | |

FOREIGN PATENT DOCUMENTS

| | | |
|---|---|---|
| JP | 11-64455 A | 3/1999 |
| JP | 2001-21624 A | 1/2001 |
| JP | 2001-183430 A | 7/2001 |
| JP | 2004-125573 A | 4/2004 |
| JP | 2004-264046 A | 9/2004 |

OTHER PUBLICATIONS

Yamamoto et al., "Multi Strobe Circuit for 2. 133 GHz Memory Test System", ITC '06 IEEE International Test Conference, Oct. 2006, pp. 1-9.
International Search Report (ISR) issued in PCT/JP2008/064544(parent application) for Examiner consideration.
Written Opinion (PCT/ISA/237) issued in PCT/JP2008/064544 (parent application).

* cited by examiner

*Primary Examiner* — Arleen M Vazquez

(57) ABSTRACT

Provided is a test apparatus that tests a device under test, having two operational modes which are (i) an edge strobe mode in which the test apparatus judges acceptability of a value of an output signal from the device under test at sequentially designated reference timings, based on expected value information, and (ii) a multi-strobe mode in which the test apparatus judges the acceptability of values of the output signal at a plurality of strobes for each reference timing, based on expected value information, the plurality of strobes being generated based on the reference timing, and comprising a conversion control section that converts an expected value pattern supplied thereto into expected value information to be used in the edge strobe mode or into expected value information to be used in the multi-strobe mode, depending on which of the edge strobe mode and the multi-strobe mode is selected.

13 Claims, 10 Drawing Sheets

| EXPECTED VALUE PATTERN | EXP H | EXP HZ | EXP L | EXP LZ | STRB H | OPEN H | STRB L | OPEN L |
|---|---|---|---|---|---|---|---|---|
| L | 0 | 0 | 1 | 0 | 0 | 1 | 1 | 0 |
| H | 1 | 0 | 0 | 0 | 1 | 0 | 0 | 1 |
| Z | 0 | 1 | 0 | 1 | 1 | 0 | 1 | 0 |
| X | 0 | 0 | 0 | 0 | 0 | 1 | 0 | 1 |
| ZINV | 1 | 1 | 1 | 1 | 1 | 0 | 1 | 0 |
| Tr | 1 | 0 | 1 | 0 | 1 | 0 | 1 | 0 |

FIG. 5

| MTU | EXPECTED VALUE PATTERN | EXP HZ | EXP H | STRB H | OPEN H |
|---|---|---|---|---|---|
| 1 | X(10) | 1 | 0 | 0 | 1 |
| 1 | X(11) | 1 | 1 | 0 | 1 |
| 1 | X(00) | 0 | 0 | 0 | 1 |
| 1 | X(01) | 0 | 1 | 0 | 1 |
| 0 | X(10) | 1 | 0 | 0 | 1 |
| 0 | X(11) | 1 | 1 | 0 | 1 |
| 0 | L(00) | 0 | 0 | 1 | 0 |
| 0 | H(01) | 0 | 1 | 1 | 0 |

*FIG. 7*

TEST APPARATUS, TEST METHOD AND MANUFACTURING METHOD

CROSS REFERENCE TO RELATED APPLICATION

This is a continuation application of PCT/JP2008/64544 filed on Aug. 13, 2008. This application is also a continuation-in-part of PCT/JP2007/066104 filed on Aug. 20, 2007.

BACKGROUND

1. Technical Field

The present invention relates to a test apparatus and a test method. In particular, the present invention relates to a test apparatus and a test method for testing a device under test such as a semiconductor circuit, and to a method for manufacturing an electronic device using this test method.

2. Related Art

A known test apparatus for testing a device under test such as a semiconductor circuit judges acceptability and rank of the device under test based on whether timing information of a signal under measurement output by the device under test matches expected timing conditions. For example, Japanese Patent Application Publication No. 2005-293808 discloses a test apparatus that detects a logic value of each bit of the signal under measurement according to a strobe signal synchronized with the bit rate of the signal under measurement (referred to hereinafter as an "edge strobe"), and compares the detected logic pattern to an expected value pattern.

Japanese Patent Application Publication No. 2004-125573 discloses a test apparatus that generates a plurality of strobe signals in series (referred to hereinafter as a "multi-strobe") in each cycle of the signal under measurement to detect the edge positions of the signal under measurement. In this case, the test apparatus judges the acceptability of the device under test based on whether the edge position is within a prescribed range, for example.

In order to perform various tests on the device under test, the test apparatus desirably has the two functions described above. However, the expected values, control information, and the like to be used when performing a test with the edge strobe are different from the expected values, control information, and the like to be used when performing a test with the multi-strobe. Generally, the expected values and the like used for testing are stored in a memory in advance. Therefore, when the test apparatus is provided with the two functions described above, a memory and control system is provided for each function, thereby increasing the cost and power consumption of the test apparatus.

SUMMARY

Therefore, it is an object of an aspect of the innovations herein to provide a test apparatus, a test method, and a manufacturing method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus and test method may include a test method using a test apparatus that tests a device under test, having two operational modes which are (i) an edge strobe mode in which the test apparatus judges acceptability of a value of an output signal from the device under test at sequentially designated reference timings, based on expected value information, and (ii) a multi-strobe mode in which the test apparatus judges the acceptability of values of the output signal at a plurality of strobes for each reference timing, based on expected value information, the plurality of strobes being generated based on the reference timing, and comprising a conversion control section that converts an expected value pattern supplied thereto into expected value information to be used in the edge strobe mode or into expected value information to be used in the multi-strobe mode, depending on which of the edge strobe mode and the multi-strobe mode is selected. In addition, an electronic device manufacturing method is provided that involves using the above test method to select electronic devices.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 5 shows an exemplary correspondence between the expected value pattern and the expected value information in the edge strobe mode.

FIG. 7 shows an exemplary correspondence between the expected value pattern and the expected value information in the multi-strobe mode.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
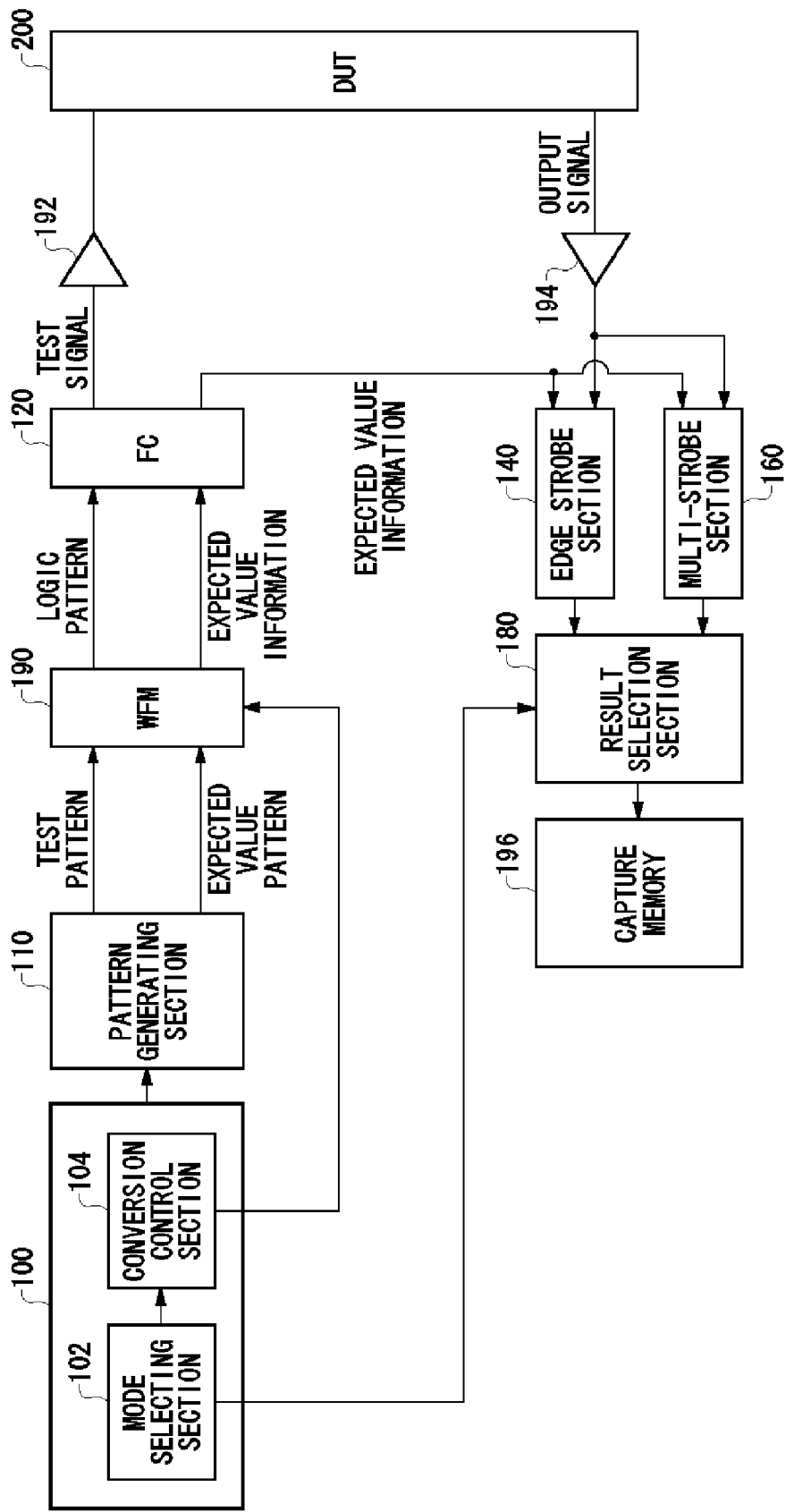
FIG. 1 shows an exemplary configuration of a test apparatus 10 according to an embodiment of the present invention.

FIG. 1 shows an exemplary configuration of a test apparatus 10 according to an embodiment of the present invention. The test apparatus 10 tests a device under test 200 such as a semiconductor circuit and has two operational modes, which are an edge strobe mode and a multi-strobe mode. The edge strobe mode and multi-strobe mode will be explained first, and then the configuration and performance of the test apparatus 10 will be described.

Figure 2:
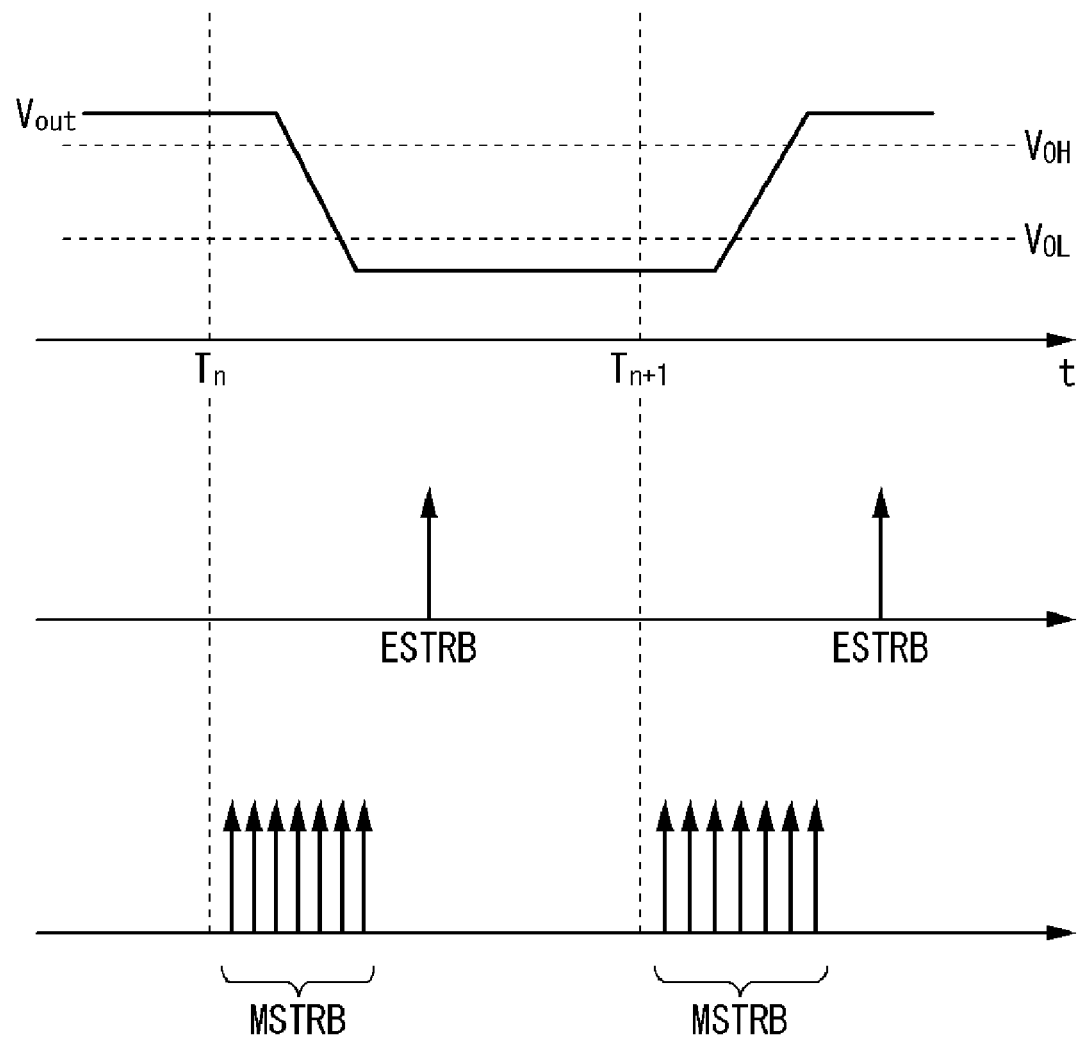
FIG. 2 shows examples of the edge strobe mode and the multi-strobe mode.

FIG. 2 shows examples of the edge strobe mode and the multi-strobe mode. In both modes, the test apparatus 10 generates level comparison result signals SH and SL by comparing the signal level of an output signal Vout of the device under test 200 to threshold values VOH and VOL. For example, the level comparison result signal SH has a binary logic value indicating whether the signal level of the output signal Vout is higher than the threshold value VOH.

In the edge strobe mode, the test apparatus 10 generates a single strobe pulse in each test period to detect the logic value of the output signal Vout. The test apparatus 10 of the present embodiment samples the level comparison result signals SH and SL with an edge strobe ESTRB corresponding to a reference timing. The edge strobe ESTRB may be positioned at the substantial center of each cycle of the output signal Vout, for example. Next, the test apparatus 10 judges whether the sampled logic value of the output signal Vout matches the expected value. In this way, the test apparatus 10 judges whether the logic value of the output signal Vout matches the expected value at a single timing in each period of the output signal Vout.

In the multi-strobe mode, the test apparatus 10 generates a series of strobe pulses in each test period to identify the transition timing of the logic value of the output signal Vout. The test apparatus 10 of the present embodiment samples level comparison result signals SH and SL at a plurality of points in each test period, using a multi-strobe MSTRB corresponding to the reference timing. The multi-strobe MSTRB may be positioned near the edge of the output signal in each cycle division of the output signal Vout. The reference timing may be one designated timing in each test period.

The test apparatus 10 samples the level comparison result signals SH and SL with each of the strobes in the multi-strobe MSTRB. The test apparatus 10 identifies the edge position of the output signal based on the plurality of sampled logic values. The test apparatus 10 generates sampling signals MFH and MFL by sampling the level comparison result signals SH and SL with the multi-strobe MSTRB. The test apparatus 10 calculates the edge position of the output signal based on one of the sampling signals MFH and MFL, and judges whether this edge position is within a prescribed range. In this way, the test apparatus 10 identifies the edge position in the output signal and judges acceptability based on the identified position.

The following is a description of the configuration and performance of the test apparatus 10 shown in FIG. 1. The test apparatus 10 includes a site control section 100, a pattern generating section 110, a WF memory 190, a waveform shaping section 120, a test signal supplying section 192, a level comparing section 194, an edge strobe section 140, a multi-strobe section 160, a result selecting section 180, and a capture memory 196.

The site control section 100 controls the test apparatus 10. The site control section 100 may be a work station, for example, and may control the test apparatus 10 according to a test program provided by a user. The site control section 100 may cause the pattern generating apparatus 110 to operate according to the test program. The site control section 100 includes a mode selecting section 102 and a conversion control section 104, described further below.

The pattern generating section 110 generates the expected value pattern and the test pattern based on data or the like received from the site control section 100. The test pattern may be a logic pattern for the test signal to be input to the device under test 200, a logic pattern for a control signal to be input to the device under test 200, or a pattern designating timing information or the like for the test signal. The expected value pattern may indicate the expected values for the output signal of the device under test 200.

The WF memory 190 outputs a logic pattern corresponding to the test pattern supplied thereto. For example, the WF memory 190 may store in advance a logic pattern for each address, and sequentially output the logic patterns of addresses sequentially designated by the test pattern to form the logic pattern of the test signal.

The WF memory 190 also functions as a converting section that converts the expected value pattern supplied thereto into expected value information. This expected value information may include the expected values to which the logic values of the output signal are to be compared. The expected value information may include information used for signal processing by the edge strobe section 140 and the multi-strobe section 160. The WF memory 190 stores each piece of expected value information in advance and in association with each expected value pattern, and may output the expected value information corresponding to the expected value pattern received from the pattern generating section 110.

The waveform shaping section 120 shapes the waveform of the test signal based on the logic pattern output by the WF memory 190. The waveform shaping section 120 may determine the edge position or the like of the test signal based on the timing information included in the test pattern. The waveform shaping section 120 may supply the expected value information output by the WF memory 190 to at least one of the edge strobe section 140 and the multi-strobe section 160. The waveform shaping section 120 may supply expected value information for each cycle of the output signal of the device under test 200.

The test signal supplying section 192 receives the test signal output by the waveform shaping section 120, converts the test signal into an analog voltage having a prescribed amplitude, and supplies this voltage to the device under test 200. The test signal supplying section 192 may include a driver that outputs a voltage corresponding to the logic value of the test signal.

The device under test 200 operates in response to the test signal supplied thereto to output an output signal. If the device under test 200 is a semiconductor memory, the test apparatus 10 may perform a test that involves writing to or reading from an address designated by the test signal. If the device under test 200 is a normal integrated circuit, the test apparatus 10 may perform a test suitable for such an integrated circuit.

The level comparing section 194 outputs comparison results obtained by comparing the signal level of the output signal of the device under test 200 to predetermined threshold values. The level comparing section 194 may output the level comparison result signal SH that is logic H when the signal level of the output signal is greater than the predetermined threshold value VOH and is logic L when the signal level of the output signal is less than the threshold value VOH. Furthermore, the level comparing section 194 may output the level comparison result signal SL that is logic H when the signal level of the output signal is less than the predetermined threshold value VOL and is logic L when the signal level of the output signal is greater than the threshold value VOL. Here, the threshold value VOH is greater than the threshold value VOL. In this way, the analog waveform of the output signal of the device under test 200 can be converted into a binary logic waveform.

The edge strobe section 140 acquires the logic value of the output signal of the device under test 200 at a designated reference timing. The edge strobe section 140 performs the edge strobe mode sampling operation described in FIG. 2. The edge strobe section 140 of the present embodiment samples the logic value of the output signal at the reference timing by sampling the level comparison result signals SH and SL output by the level comparing section 194 at this reference timing. The edge strobe section 140 may generate sampling signals FH and FL by sampling, at the reference timing, the level comparison result signal SH using the threshold value VOH and the level comparison result signal SL using the threshold value VOL.

The test apparatus 10 may further include a timing generating section, not shown, that generates the reference timing or the edge strobe ESTRB. As another example, instead of acquiring the logic values of the output signal at the reference timing, the edge strobe section 140 may acquire the signal level of the output signal using an AD converter or the like.

The edge strobe section 140 judges the acceptability based on the sampling signals of the acquired results and the expected value information received from the waveform shaping section 120. For example, the edge strobe section 140 may judge the acceptability of the acquired results based on whether the value of the sampling signal matches the expected value indicated by the expected value information. During the edge strobe mode, the expected value information may be 1-bit data, for example.

For example, if an acceptable result is indicated when the logic value of the output signal is logic H, the pattern generating section 110 may output an expected value pattern having logic H. The WF memory 190 functioning as the converting section generates expected value information indicating an expected value for the sampling signal FH and an expected value for the sampling signal FL, based on this expected value pattern. If the sampling signals FL and FH both match their respective expected values, the edge strobe section 140 judges that the acquired results for the value of the output signal are acceptable.

The multi-strobe section 160 samples the output signal at a plurality of points corresponding to a plurality of strobes, i.e. the multi-strobe, generated based on the reference timing. For example, the multi-strobe section 160 samples the level comparison result signals SH and SL output by the level comparing section 194 at a plurality of strobe timings whose phase differences gradually change relative to the reference timing. The multi-strobe section 160 may generate sampling signals MFH and MFL by sampling the level comparison result signals SH and SL at the timing of the multi-strobe.

The multi-strobe section 160 judges the acceptability of the acquired results for the value of the output signal based on the expected value information supplied from the waveform shaping section 120. The multi-strobe section 160 performs the multi-strobe mode sampling operation described in FIG. 2. For example, the multi-strobe section 160 may select whichever of the sampling signals MFH and MFL is designated by the expected value information.

When the sampling signal MFH is selected, the pattern generating section 110 outputs an expected value pattern having logic H. The WF memory 190 functioning as the converting section generates the expected value information designating the sampling signal MFH, based on this expected value pattern.

During the multi-strobe mode, the expected value information may be 4-bit code data if the multi-strobe section 160 has a configuration to sample 16 sampling points. This 4-bit code data may be used to hold a code value in the WF memory 190 or the waveform shaping section 120.

The multi-strobe section 160 may calculate the edge position or the like of the output signal based on the selected sampling signal. The multi-strobe section 160 judges the acceptability of the acquired results for the value of the output signal based on whether the calculated edge position or the like is within a prescribed range. For example, the multi-strobe section 160 can judge the acceptability of the acquired results using the process described above.

In this way, even if the pattern generating section 110 outputs the same expected value pattern, the expected information to be used by the edge strobe section 140 operating in the edge strobe mode and the expected value information to be used by the multi-strobe section 160 operating in the multi-strobe mode can be different. Therefore, the WF memory 190 functioning as the converting section can switch which expected value information to output depending on whether the edge strobe mode or the multi-strobe mode is being used.

In the present embodiment, the mode selecting section 102 selects one of the edge strobe mode and the multi-strobe mode. The mode selecting section 102 may select the mode according to a test program provided by a user or the like. The mode selecting section 102 notifies the conversion control section 104 and the result selecting section 180 concerning the selection result.

The conversion control section 104 converts the expected value pattern output by the WF memory 190 functioning as the converting section into expected value information for the edge strobe section 140 or expected value information for the multi-strobe section 160, based on whether the edge strobe mode or the multi-strobe mode is selected. When the mode selecting section 102 selects the edge strobe mode, the conversion control section 104 may write in advance to the WF memory 190 each piece of expected value information for the edge strobe section 140 corresponding to each expected value pattern, and when the mode selecting section 102 selects the multi-strobe mode, the conversion control section 104 may write in advance to the WF memory 190 each piece of expected value information for the multi-strobe section 160 corresponding to each expected value pattern.

In this way, the expected value information output by the WF memory 190 can be switched according to the mode. Furthermore, since the expected value information for the mode not being used is not stored, the amount of capacity used in the WF memory 190 is decreased.

The conversion control section 104 may write expected value information with the same bit length to the WF memory 190 for both the expected value information for the edge strobe section 140 and the expected value information for the multi-strobe section 160. The waveform shaping section 120 may supply the expected value information output by the WF memory 190 in parallel to the edge strobe section 140 and the multi-strobe section 160. In this case, the strobe section that does not correspond to the selected mode may also output judgment results corresponding to the expected value information. However, since the expected value information does not correspond to this strobe section, the judgment results output by this strobe section may be prevented from being output or each bit of the judgment result may be masked with a prescribed logic value.

The result selecting section 180 selects the judgment results output by the edge strobe section 140 when the edge strobe mode is selected by the mode selecting section 102, and selects the judgment results output by the multi-strobe section 160 when the multi-strobe mode is selected by the mode selecting section 102. With this configuration, judgment results corresponding to the mode that is not selected can be easily obtained.

The capture memory 196 stores the judgment results selected by the result selecting section 180. If the device under test 200 is a semiconductor memory, the capture memory 196 may be provided with a memory capacitance equal to the memory capacitance of the address spaces of the semiconductor memory, and may cumulatively add the address spaces corresponding to the addresses of the semiconductor memory being read. The test apparatus 10 described above operates in both the edge strobe mode and the multi-strobe mode, and has a small circuit size. Therefore, the cost and power consumption of the test apparatus 10 are decreased.

Figure 3:
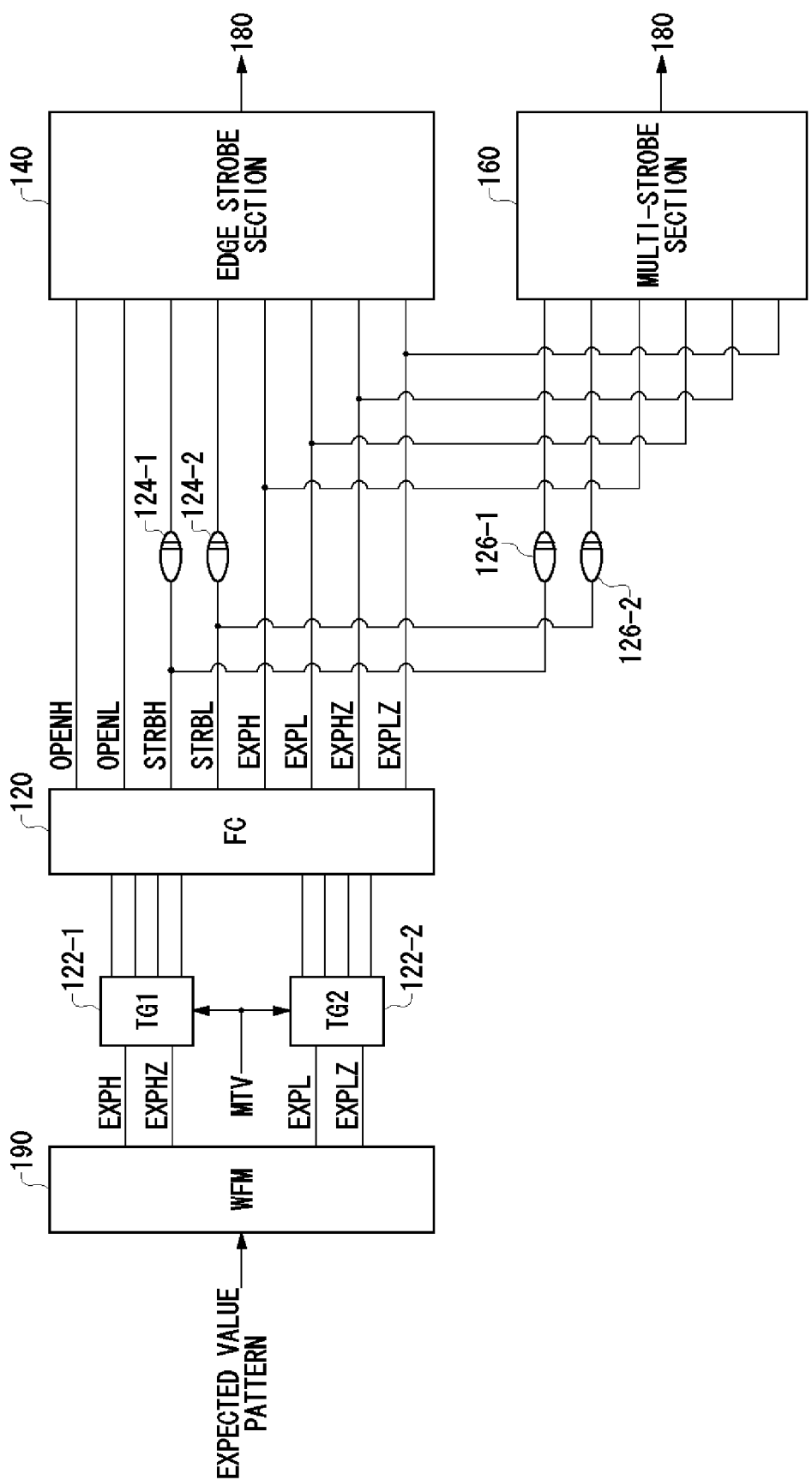
FIG. 3 shows an exemplary configuration for transmitting the expected value information between the WF memory 190, the waveform shaping section 120, the edge strobe section 140, and the multi-strobe section 160.

FIG. 3 shows an exemplary configuration for transmitting the expected value information between the WF memory 190, the waveform shaping section 120, the edge strobe section 140, and the multi-strobe section 160. The test apparatus 10 of the present embodiment further includes a TG circuit 122-2, a TG circuit 122-2, and timing adjustment delay circuits 124-1, 124-2, 126-1, and 126-2.

The WF memory 190 outputs the expected value information corresponding to the expected value pattern received from the pattern generating section 110. The expected value information in this example includes 4 bits, which are EXPH, EXPHZ, EXPL, and EXPLZ.

The TG circuit 122-1 receives 2 bits (EXPH, EXPHZ) of the expected value information. The TG circuit 122-2 receives the other 2 bits (EXPL, EXPLZ) of the expected value information. Each TG circuit 122 outputs expected value information to which is added new 2-bit information corresponding to the received 2-bit information.

For example, the TG circuit 122-1 outputs the 4 bits of EXPH, EXPHZ, OEPNH, and STRBH. The TG circuit 122-2 may output the 4 bits of EXPL, EXPLZ, OPENL, and STRBL. Each TG circuit 122 may generate OPENH/L and STRBH/L according to a mask signal MTV supplied thereto.

The waveform shaping section 120 outputs a waveform corresponding to each bit in the expected value information output by the TG circuit 122-1 and the TG circuit 122-2. For example, the waveform shaping section 120 may include a plurality of output ports provided in parallel and corresponding respectively to the bits of the expected value information. When the logic value of each bit in the expected value information is 1, the waveform shaping section 120 outputs one pulse from the output port corresponding to each bit.

As described above, the edge strobe section 140 and the multi-strobe section 160 may receive the expected value information output by the waveform shaping section 120 in parallel. Furthermore, the edge strobe section 140 and the multi-strobe section 160 may receive the output signal of the device under test in parallel and output the acceptability judgment results in parallel.

STRBH and STRBL output by the waveform shaping section 120 define the reference timing for the edge strobe section 140 and the multi-strobe section 160. STRBH may define the reference timing for sampling of the level comparison result signal SH, and STRBL may define the reference timing for sampling of the level comparison result signal SL. The waveform shaping section 120 of the present embodiment can function as a timing generating section to generate the reference timing and supply this reference timing to each strobe section.

The timing adjustment delay circuits 124-1, 124-2, 126-1, and 126-2 adjust the reference timing of the level comparison result signals SH and SL in each strobe section by individually delaying STRBH and STRBL input to the edge strobe section 140 and the multi-strobe section 160.

The delay information concerning the delays of the timing adjustment delay circuits 124 and timing adjustment delay circuits 126 may be provided in advance as timing information in the waveform shaping section 120. The timing information provided in the waveform shaping section 120 is assembled in a plurality of groups by a memory or the like, and the delay amounts of the timing adjustment delay circuits 124 and timing adjustment delay circuits 126 can be set in real time by switching the timing information according to a timing set signal TS, not shown, received from the pattern generating section 110.

In this way, the strobe timing of the edge strobe ESTRB and the multi-strobe MSTRB shown in FIG. 2 can be set in real time by the timing set signal TS. Furthermore, testing can be performed while selectively switching the strobe mode to the edge strobe mode or the multi-strobe mode, and so a variety of integrated circuits and semiconductor memories can be tested.

Figure 4:
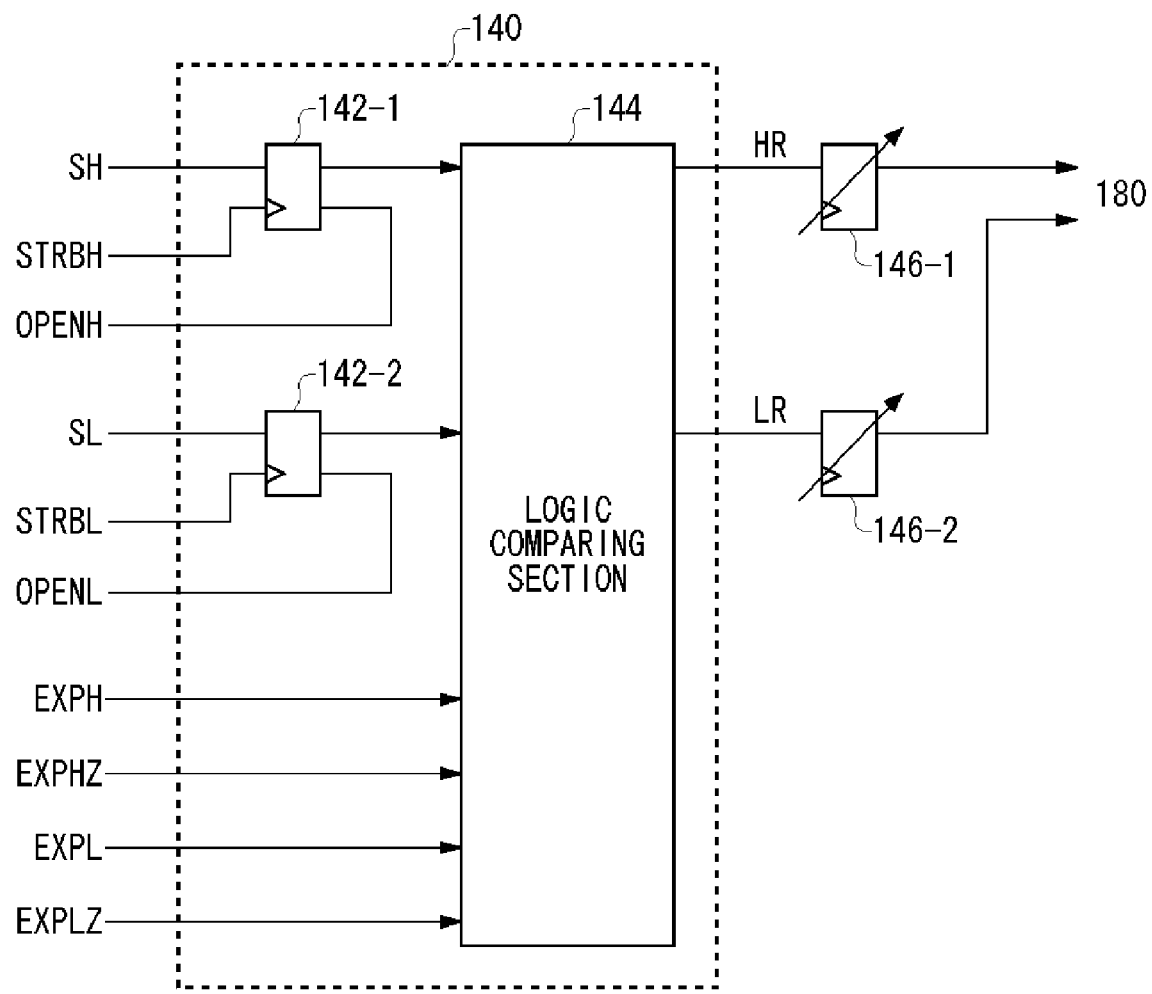
FIG. 4 shows an exemplary configuration of the edge strobe section 140.

FIG. 4 shows an exemplary configuration of the edge strobe section 140. The edge strobe section 140 includes a timing comparing section 142-1, a timing comparing section 142-2, a logic comparing section 144, a result delaying section 146-1, and a result delaying section 146-2.

The timing comparing section 142-1 acquires the logic value FH of the level comparison result signal SH, according to the pulse of STRBH. The timing comparing section 142-2 acquires the logic value FL of the level comparison result signal SL, according to the pulse of STRBL. The timing comparing sections 142-1 and 142-2 may acquire the logic values of the level comparison result signals SH and SL on a condition that OPENH and OPENL input thereto are logic L. Furthermore, the timing comparing sections 142-1 and 142-2 may be flip-flops that receive the level comparison result signals SH and SL at signal input terminals thereof and receive STRBH and STRBL at clock input terminals thereof.

The logic comparing section 144 judges whether the logic values FH and FL acquired by the timing comparing sections 142-1 and 142-2 match the logic values defined by the expected value information EXPH, EXPHZ, EXPL, and EXPLZ, and outputs logic comparison result signals HR and LR.

The result delaying sections 146 delay the judgment results output by the edge strobe section 140, i.e. the logic comparison result signals HR and LR, and supply the delayed signals to the result selecting section 180. The result delaying sections 146 may be circuits in which a number of flip-flops corresponding to the desired delay amount are connected in cascade. Each flip-flop in the result delaying sections 146 may receive a reference clock that defines the operational period of the test apparatus 10. In this way, the result delaying sections 146 can generate delays that are integer multiples of the period of the reference clock.

As described in FIG. 2, the processing of the level comparison result signals SH and SL is different in the edge strobe section 140 and in the multi-strobe section 160. Therefore, the edge strobe section 140 and the multi-strobe section 160 have different processing times, and so the respective judgment results do not necessarily reach the result selecting section 180 at the same time. In order to ensure that the judgment results are input to the result selecting section 180 at the same time, the result delaying sections 146 may delay the judgment results output by the edge strobe section 140 such in a manner to cancel out the difference in processing time.

FIG. 5 shows an exemplary correspondence between the expected value pattern and the expected value information in the edge strobe mode. In the edge strobe mode, the pattern generating section 110 generates a pattern indicating one of L, H, Z, X, ZINV, and Tr as the expected value pattern. The pattern generating section 110 may output this expected value pattern as 4-bit data.

The expected value pattern L, for example, has an expected value indicating that the logic value of the output signal should be L. If the logic value of the output signal is not L, the logic comparing section 144 may output a logic comparison result signal LR with a value of 1, indicating a fail. The logic comparing section 144 may judge whether the logic value of the output signal is L based on the logic value FL. Furthermore, in the case of the expected value pattern L, the logic comparing section 144 may output a logic comparison result signal HR with a value of 0, regardless of the logic value FH.

The logic comparing section 144 generates the logic comparison result signals HR and LR by performing a logic computation involving the logic values FH and FL and the expected value information EXPH, EXPHZ, EXPL, and EXPLZ. For this expected value pattern, the WF memory 190 outputs the expected value information EXPH, EXPHZ, EXPL, and EXPLZ that causes the logic comparing section 144 to function in the manner described above.

The expected value pattern H has an expected value indicating that the logic value of the output signal should be H. If the logic value of the output signal is not H, the logic comparing section 144 may output a logic comparison result signal HR with a value of 1, indicating a fail. The logic comparing section 144 may judge whether the logic value of the output signal is H based on the logic value FH. Furthermore, in the case of the expected value pattern H, the logic comparing section 144 may output a logic comparison result signal LR with a value of 0, regardless of the logic value FL. For this expected value pattern as well, the WF memory 190 outputs the expected value information EXPH, EXPHZ, EXPL, and EXPLZ that causes the logic comparing section 144 to function in the manner described above.

The expected value pattern X has an expected value indicating that logic comparison result signals HR and LR having a value of 0, indicating "don't care," should be output regardless of the logic value of the output signal. In this case, the logic comparing section 144 outputs logic comparison result signals HR and LR having a value of 0 regardless of the logic values FH and FL. For this expected value pattern as well, the WF memory 190 outputs the expected value information EXPH, EXPHZ, EXPL, and EXPLZ that causes the logic comparing section 144 to function in the manner described above.

The expected value patterns Z and ZINV have expected values indicating that the output impedance of the device under test 200 should be a prescribed state. The expected value Tr has an expected value indicating that the edge of the output signal should be sampled. In response to these expected value patterns as well, the WF memory 190 outputs the expected value information EXPH, EXPHZ, EXPL, and EXPLZ that causes the logic comparing section 144 to function according to these expected value patterns.

The waveform shaping section 120 may generate STRBH, STRBL, OPENH, and OPENL shown in FIG. 5 based on the expected value information supplied thereto. As a result, the edge strobe section 140 can perform the edge strobe mode processing.

Figure 6:
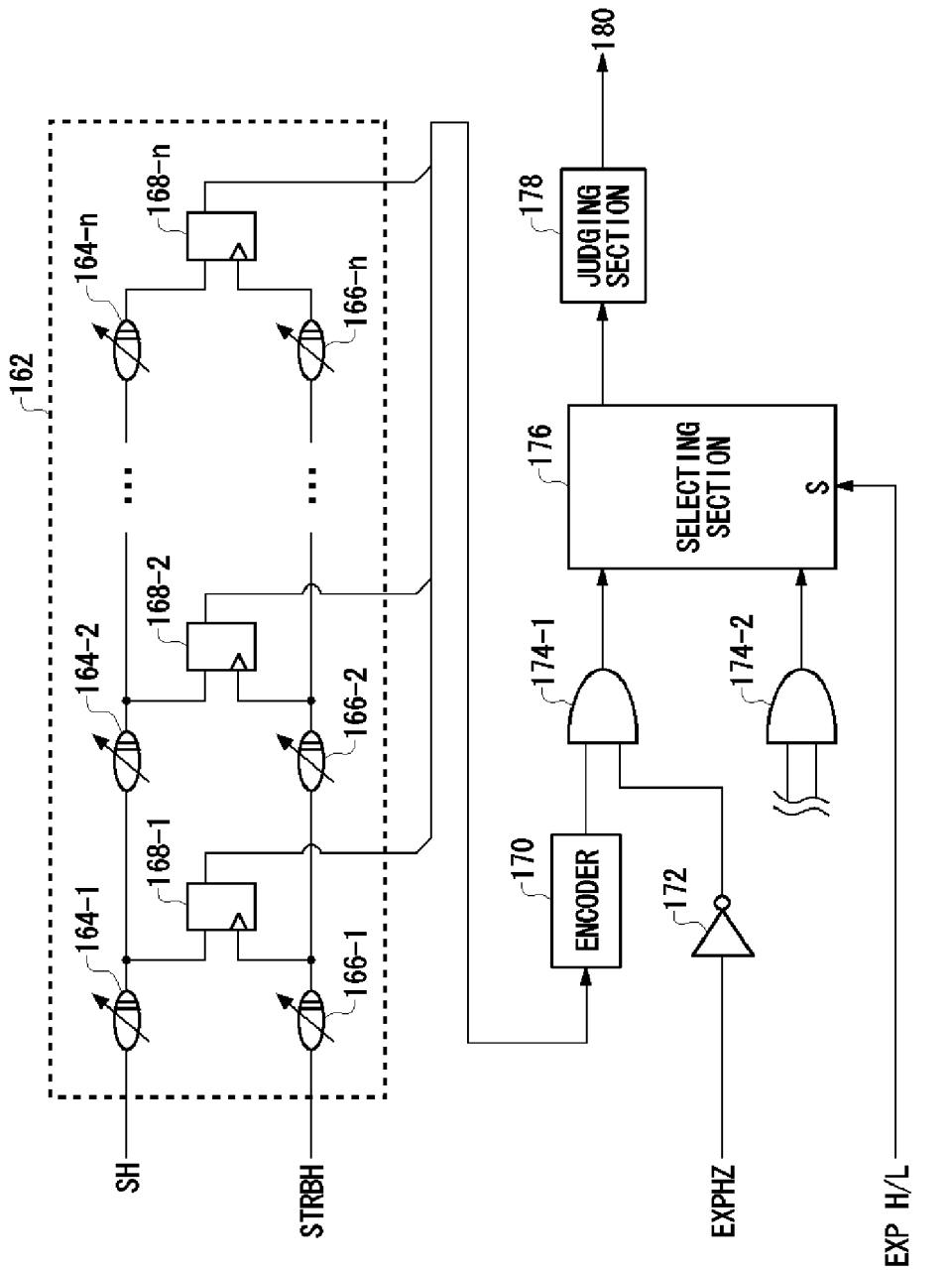
FIG. 6 shows an exemplary configuration of the multi-strobe section 160.

FIG. 6 shows an exemplary configuration of the multi-strobe section 160. The multi-strobe section 160 includes a sampling section 162, an encoder 170, an inverter 172, an AND circuit 174, a selecting section 176, and a judging section 178. The multi-strobe section 160 includes one each of the sampling section 162, the encoder 170, the inverter 172, and the AND circuit 174 for each of the level comparison result signals SH and SL, but in FIG. 6, the sampling section 162, encoder 170, and inverter 172 corresponding to the level comparison result signal SL are omitted.

The sampling section 162 includes n output signal side delay circuits 164, n strobe side delay circuits 166, and n acquiring sections 168, where n is an integer greater than 1. The n output signal side delay circuits 164 are connected in cascade, and sequentially delay the output signal, which is the level comparison result signal SH or SL in the present embodiment. The delay amount of each output signal side delay circuit 164 may be the same. The sampling section 162 receives the level comparison result signal SH and outputs n pieces of sampling data sampled at substantially constant intervals.

The strobe side delay circuits 166 are provided to correspond one-to-one with the output signal side delay circuits 164. The strobe side delay circuits 166 are connected in cascade, and sequentially delay the strobe signals STBH/L, i.e. the reference timing, input thereto. The delay amount of each strobe side delay circuit 166 may be substantially the same. However, the delay amounts of the output signal side delay circuits 164 and the strobe side delay circuits 166 are different. By setting the delays to gradually change the phase difference of the level comparison result signals SH and SL and the strobe signals, the level comparison result signal SH can be sampled at substantially constant intervals.

The acquiring sections 168 are provided to correspond one-to-one with the output signal side delay circuits 164. Each acquiring section 168 acquires the logic values of the level comparison result signals SH and SL output by the corresponding output signal side delay circuit 164, at a timing of the strobe signal output by the corresponding strobe side delay circuit 166. The acquiring sections 168 may be flip-flops.

With this configuration, the logic values of the level comparison result signals SH and SL can be acquired with a plurality of strobes having phases that are gradually shifted according to the delay amounts of the output signal side delay circuits 164 and the strobe side delay circuits 166. Therefore, the edge position in the output signal can be detected based on the position of the acquiring section 168 at which the acquired logic value transitions. The logic values output by the acquiring sections 168 are input to the encoder 170 as n pieces of sampling data.

The encoder 170 converts the bit position at which the logic value transitions in the n pieces of sampling data into encoded data represented as a binary value. More specifically, the encoder 170 receives the sampling data and converts this data into parallel data by retiming the data in an n-bit register, and then converts the data into the binary encoded data and outputs the encoded data. With this encoded data, the edge position in the output signal can be identified as a code value. If n is equal to 15, for example, the encoder 170 outputs 4-bit encoded data.

The AND circuit 174-1 outputs the AND of the encoded data output by the encoder 170 and the logic value output by the inverter 172. In other words, when the inverter 172 outputs logic L, the AND circuit 174-1 outputs encoded data with a value of 0.

The inverter 172 inverts and outputs one predetermined bit of the expected value information output by the waveform shaping section 120. The inverter 172 of the present embodiment inverts and outputs the bit EXPHZ (or EXPLZ) of the expected value information. For example, when the expected value information EXPHZ is 1, the inverter 172 masks the data output by the AND circuit 174-1 to be 0 so that the acceptability judgment is not performed using the encoded data corresponding to the level comparison result signal SH.

The selecting section 176 selects either the encoded data output by the AND circuit 174-1 or the encoded data output by the AND circuit 174-2, and outputs the selected data. The selecting section 176 selects the encoded data based on the EXPH/L bits in the expected value information output by the waveform shaping section 120. The selecting section 176 may select the encoded data corresponding to a bit having a prescribed value among the EXPH/L bits.

The judging section 178 judges the acceptability of the measurement results for the output signal based on the encoded data output by the selecting section 176. The judging section 178 may judge the acceptability based on a comparison result between the code value of the encoded data and a comparison code value.

FIG. 7 shows an exemplary correspondence between the expected value pattern and the expected value information in the multi-strobe mode. The WF memory 190 stores expected value information EXPHZ, EXPH, EXPLZ, and EXPL, but only EXPHZ and EXPH are shown in FIG. 7. The WF memory 190 may store the same information for EXPLZ and EXPL as for EXPHZ and EXPL.

In the multi-strobe mode, the pattern generating section 110 generates a pattern indicating one of L, H, and X as the expected value pattern. The pattern generating section 110 may output this expected value pattern as 2-bit data. Furthermore, 2-bit data is output in the same manner for EXPLZ and EXPL, and so the pattern generating section 110 outputs a 4-bit expected value pattern in the same manner as in the edge strobe mode. The TG circuit 122-1 shown in FIG. 3 generates STRBH and OPENH based on EXPHZ, EXPH, and the mask signal MTV provided thereto.

The expected value pattern L indicates that the acceptability judgment is to be performed with the selecting section 176 selecting the encoded data corresponding to the level comparison result signal SL, for example. The expected value pattern H indicates that the acceptability judgment is to be performed with the selecting section 176 selecting the encoded data corresponding to the level comparison result signal SH. The expected value pattern X indicates that the acceptability judgment is not to be performed for any of the encoded data.

If the mask signal is logic H, the TG circuits 122 output STRB bits having logic L and OPEN bits having logic H. In this way, the output of the AND circuit 174 is masked by the inverter 172 and no reference timing is input to the multi-strobe section 160, and so the multi-strobe section 160 does not judge the acceptability based on the encoded data.

If the expected value pattern X is used, the TG circuits 122 output STRB bits having logic L and OPEN bits having logic H. Therefore, in this case as well, the multi-strobe section 160 does not judge the acceptability based on the encoded data. At this time, the WF memory 190 outputs, as the expected value information, data that causes the TG circuits 122 to function as described above. The WF memory 190 of the present embodiment may output EXPHZ with a value of 1 and any data as EXPH in this case.

If the expected value patterns L or H are used, the WF memory 190 of the present embodiment may output EXPHZ with a value of 0 and data corresponding to the expected value as EXPH. At this time, the TG circuits 122 output STRB bits having logic H and OPEN bits having logic L. In this way, the multi-strobe section 160 can select the encoded data corresponding to the expected value information to perform the acceptability judgment.

As described above, the expected value information to be input to the edge strobe section 140 and the expected value information to be input to the multi-strobe section 160 may be different, even when the bit pattern of the expected value pattern is the same. The test apparatus 10 of the present embodiment can change the expected value information stored by the WF memory 190 depending on whether the edge strobe mode or the multi-strobe mode is being used, and can therefore supply the edge strobe section 140 and the multi-strobe section 160 with expected value information appropriate for each mode.

Figure 8:
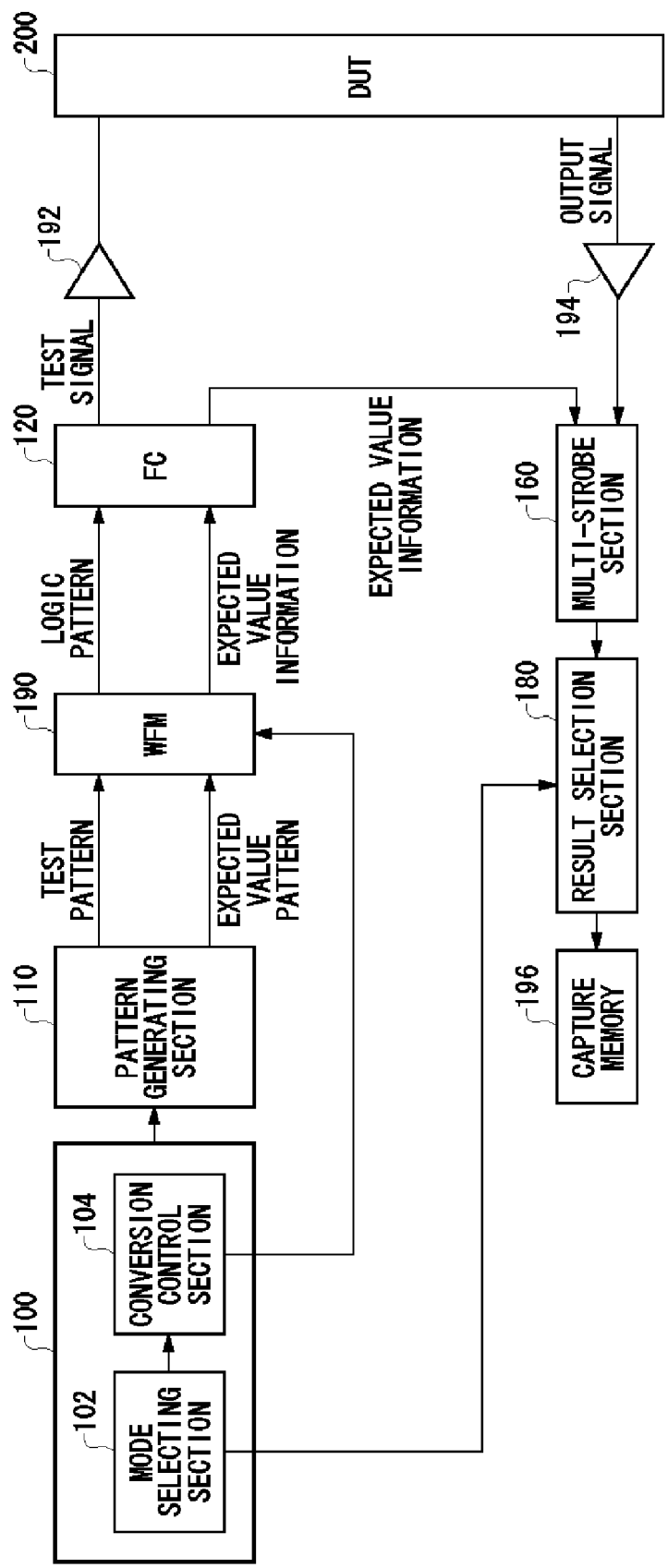
FIG. 8 shows another exemplary configuration of the test apparatus 10.

FIG. 8 shows another exemplary configuration of the test apparatus 10. The test apparatus 10 of the present embodiment differs from the test apparatus 10 described in FIG. 1 in that the test apparatus 10 of the present embodiment does not include the edge strobe section 140. Aside from this difference, the test apparatus 10 of the present embodiment has the same configuration as the test apparatus 10 of FIG. 1.

The test apparatus 10 of the present embodiment acquires the output signal using the multi-strobe section 160 in both the edge strobe mode and the multi-strobe mode. The multi-strobe section 160 may have the same configuration as the multi-strobe section 160 described in FIG. 6. The WF memory 190 in the present embodiment converts the expected value pattern into expected value information used in each mode, according to which of the edge strobe mode and the multi-strobe mode is selected, and outputs this expected value information.

The result selecting section 180 performs a different process on the data received from the multi-strobe section 160 depending on which of the edge strobe mode and the multi-strobe mode is selected. When the multi-strobe mode is selected, the result selecting section 180 may output the judgment results received from the multi-strobe section 160 as-is to the capture memory 196. When the multi-strobe mode is selected, the result selecting section 180 may select the judgment result corresponding to a predetermined strobe from among the judgment results received from the multi-strobe section 160, and output the selected judgment result to the capture memory 196.

Figure 9:
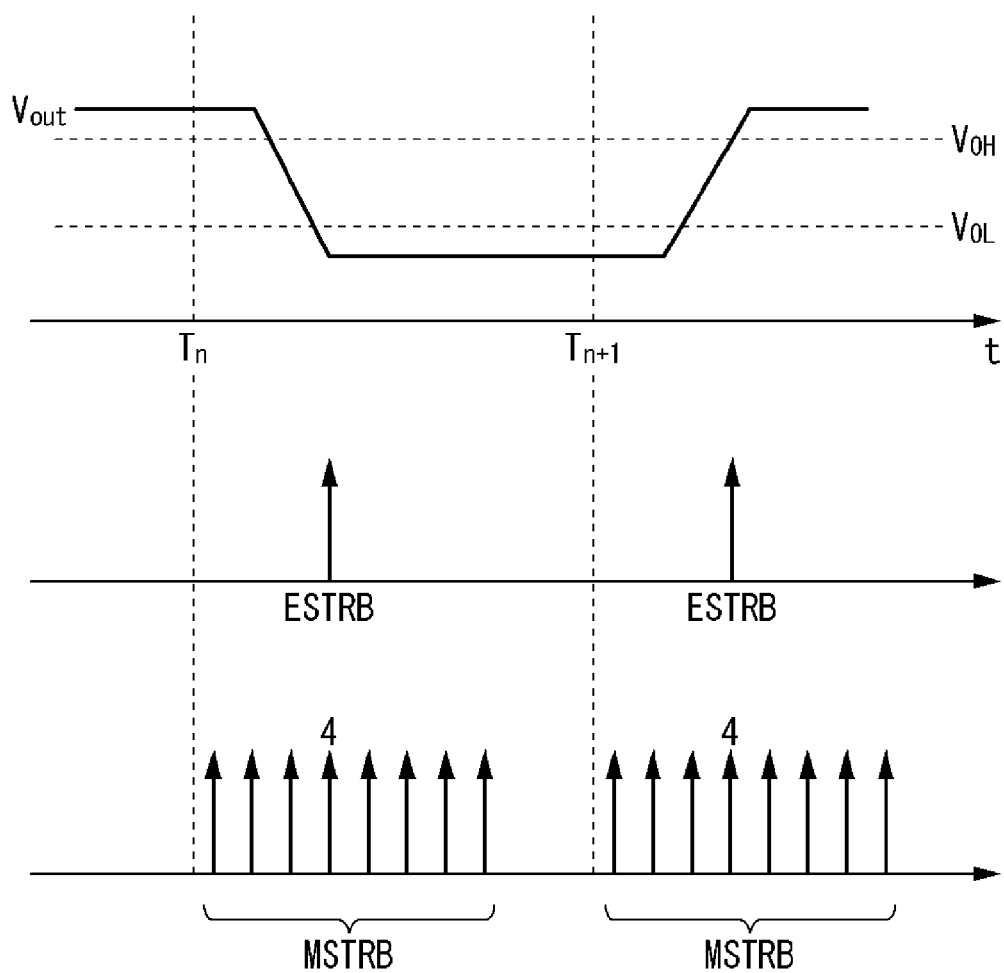
FIG. 9 shows an exemplary operation of the test apparatus 10 described in FIG. 8.

FIG. 9 shows an exemplary operation of the test apparatus 10 described in FIG. 8. In the present embodiment, the timing at which the value of the output signal is to be acquired in the edge strobe mode is the timing of the fourth strobe from among the plurality of strobes in each test period.

As described above, in the multi-strobe mode, the result selecting section 180 may output the judgment results received from the multi-strobe section 160 as-is to the capture memory 196. In the edge strobe mode, the result selecting section 180 selects the judgment result corresponding to the fourth strobe in each multi-strobe, and outputs the selected judgment result to the capture memory 196. The result selecting section 180 may select the same strobe in each of the multi-strobes, or may select a different strobe in each multi-strobe.

With this configuration, the test apparatus 10 can operate in both the edge strobe mode and the multi-strobe mode, without requiring the edge strobe section 140 described in FIG. 1. Therefore, the circuit size of this test apparatus 10 can be decreased.

In the test apparatuses 10 described in relation to FIGS. 1 to 9, the multi-strobe section 160 may output the acquired output signal values according to the strobe. In this case, the result selecting section 180 may receive the expected value information and make a comparison between the value of the output signal and the expected value information.

For example, when the test apparatus 10 of FIG. 8 is in the edge strobe mode, the result selecting section 180 may make a comparison between (i) a value corresponding to a predetermined strobe in each multi-strobe, from among the values received form the multi-strobe section 160, and (ii) the expected value information, and output the result of the comparison as the judgment result. Furthermore, when the test apparatus 10 of FIG. 8 is in the multi-strobe mode, the result selecting section 180 may output a judgment result obtained from a comparison between each value received from the multi-strobe section 160 and the expected value information.

A test method using the test apparatuses 10 described in FIGS. 1 to 9 can be applied to a method for manufacturing of an electronic device such as a semiconductor circuit or the like. This manufacturing method involves forming electronic devices, testing the electronic devices according to the method described in FIGS. 1 to 9, and completing the manufacturing of the electronic devices by determining acceptable electronic devices based on test results for the electronic devices and/or ranking the electronic devices according to electrical characteristics thereof. This manufacturing method may also include completing the manufacturing of the electronic devices by removing electronic devices that are unacceptable or whose rank is not within a desired range, based on the test results for the electronic devices.

Figure 10:
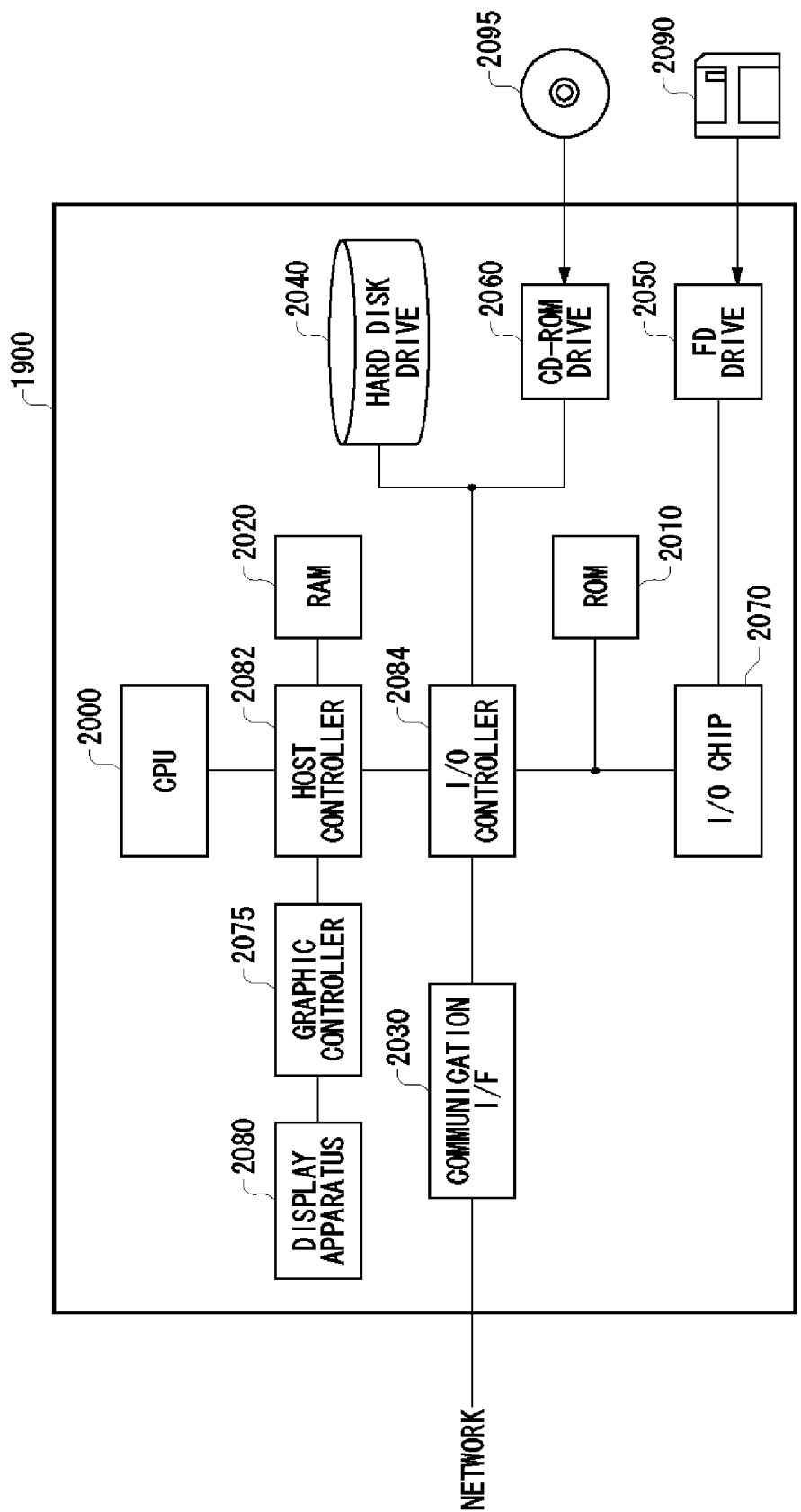
FIG. 10 shows an example of a hardware configuration of a computer 1900 according to the present embodiment.

FIG. 10 shows an example of a hardware configuration of a computer 1900 according to the present embodiment. The computer 1900 functions as the test apparatus 10 or a portion of the test apparatus 10 described in FIGS. 1 to 9, according to a program supplied thereto. The computer 1900 may function as the site control section 100. In this case, the computer 1900 may control the pattern generating section 110, the WF memory 190, the waveform shaping section 120, the test signal supplying section 192, the level comparing section 194, the edge strobe section 140, the multi-strobe section 160, the result selecting section 180, and the capture memory 196 described in FIGS. 1 to 9. The program supplied to the computer 1900 may cause the computer 1900 to function as the mode selecting section 102 and the conversion control section 104 described in FIGS. 1 to 9.

The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, and the hard disk drive 2040, and the CD-ROM drive 2060 to the host controller 2082. The communication interface 2030 communicates with other apparatuses via a network. For example, the communication interface 2030 may exchange data with the pattern generating section 110, the WF memory 190, the result selecting section 180, the capture memory 196, and the like.

The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 with each of the input/output apparatuses via a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

These programs are installed in the computer 1900. These programs prompt the CPU 2000 or the like to make the computer 1900 function as the site control section 100 as described above.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As described above, the embodiments of the present invention can be used to realize a test apparatus that has both an edge strobe mode and a multi-strobe mode. Furthermore, since less capacity is required for the WF memory 190 and the like, this test apparatus can be manufactured at a low cost.

What is claimed is:

1. A test apparatus that tests a device under test, wherein the test apparatus has two operational modes which are (i) an edge strobe mode in which the test apparatus judges acceptability of a value of an output signal from the device under test at sequentially designated reference timings, based on expected value information, and (ii) a multi-strobe mode in which the test apparatus judges the acceptability of values of the output signal at a plurality of strobes for each reference timing, based on expected value information, the plurality of strobes being generated based on the reference timing, and the test apparatus comprises a conversion control section that converts an expected value pattern supplied thereto into expected value information to be used in the edge strobe mode or into expected value information to be used in the multi-strobe mode, depending on which of the edge strobe mode and the multi-strobe mode is selected.

2. The test apparatus according to claim 1, further comprising:
a converting section that converts the expected value pattern supplied thereto into the expected value information, and outputs the expected value information; and
a mode selecting section that selects one of the edge strobe mode and the multi-strobe mode, wherein
the conversion control section causes the converting section to convert the expected value pattern into the expected value information to be used in the edge strobe mode or into the expected value information to be used in the multi-strobe mode, depending on which of the edge strobe mode and the multi-strobe mode is selected by the mode selecting section.

3. The test apparatus according to claim 2, wherein
the converting section stores the expected value pattern and the expected value information in association with each other, and outputs the expected value information corresponding to the expected value pattern input thereto, and
the conversion control section writes in advance to a memory each piece of the expected value information to be used in the edge strobe mode corresponding to each expected value pattern when the mode selecting section selects the edge strobe mode, and writes in advance to the memory each piece of the expected value information to be used in the multi-strobe mode corresponding to each expected value pattern when the mode selecting section selects the multi-strobe mode.

4. The test apparatus according to claim 3, wherein
the conversion control section writes to the memory the expected value information to be used in the multi-strobe mode and the expected value information to be used in the edge strobe mode such that both types of expected value information have the same bit length.

5. The test apparatus according to claim 4, further comprising:
an edge strobe section that acquires a value of the output signal at designated reference timings and judges whether results of the acquisition are acceptable, based on expected value information supplied thereto; and
a multi-strobe section that acquires values of the output signal at timings of a plurality of strobes for each reference timing, the plurality of strobes generated based on the reference timing, and judges acceptability of results of the acquisition based on the expected value information.

6. The test apparatus according to claim 5, wherein
the edge strobe section and the multi-strobe section receive the output signal of the device under test in parallel, receive the expected value information from the memory in parallel, and output in parallel judgment results obtained by comparing the output signal to the expected value information, and
the test apparatus further comprises:
a result selecting section that selects the judgment results from the edge strobe section when the edge strobe mode is selected and selects the judgment results from the multi-strobe section when the multi-strobe mode is selected; and
a capture memory that stores the judgment results selected by the result selecting section.

7. The test apparatus according to claim 6, further comprising a result delaying section that delays the judgment result output by the edge strobe section and inputs the delayed judgment result to the result selecting section.

8. The test apparatus according to claim 5, wherein
the multi-strobe section includes:
a plurality of output signal side delay circuits that are connected in cascade and sequentially delay the output signal;
a plurality of strobe side delay circuits that are connected in cascade and correspond one-to-one with the output signal side delay circuits, each strobe side delay circuit delaying the reference timing by a delay amount differing from that of the corresponding output signal side delay circuit; and
a plurality of acquiring sections that are provided to correspond to the plurality of output signal side delay circuits and that each acquire the delayed output signal from the corresponding output signal side delay circuit at the delayed reference timing output by the strobe side delay circuit corresponding to the corresponding output signal side delay circuit, and
the test apparatus further comprises:
a timing generating section that generates the reference timing and supplies the multi-strobe section with the reference timing; and
a timing adjustment delay circuit that delays the reference timing generated by the timing generating section and supplies the edge strobe section with the delayed reference timing.

9. The test apparatus according to claim 1, further comprising:
a multi-strobe section that acquires values of the output signal at timings of a plurality of strobes having different timings and generated based on a designated reference timing; and
a result selecting section that outputs a result obtained by comparing values acquired by the multi-strobe section at the plurality of strobes for each reference timing to the expected value information when the multi-strobe mode is selected, and outputs a result obtained by comparing a value corresponding to a predetermined one of the strobes, from among the values acquired by the multi-strobe section for each reference timing, to the expected value information when the edge strobe mode is selected.

10. The test apparatus according to claim 9, wherein
the multi-strobe section outputs a judgment result obtained by a comparison between values acquired at the plurality of strobes for each reference timing and the expected value information, and
when the edge strobe mode is selected, the result selecting section selects the judgment result corresponding to a predetermined strobe, from among the judgment results received from the multi-strobe section, and outputs the selected judgment result.

11. The test apparatus according to claim 9, wherein
the multi-strobe section outputs values acquired at a plurality of strobes for each reference timing, and
when the edge strobe mode is selected, the result selecting section outputs a judgment result obtained as a comparison between a value corresponding to a predetermined strobe, from among the values received from the multi-strobe section, and the expected value information.

12. A test method for testing a device under test, comprising:
   using two operational modes which are (i) an edge strobe mode for judging acceptability of a value of an output signal from the device under test at sequentially designated reference timings, based on expected value information, and (ii) a multi-strobe mode for judging the acceptability of values of the output signal at a plurality of strobes for each reference timing, based on expected value information, the plurality of strobes being generated based on the reference timing; and
   converting an expected value pattern supplied thereto into expected value information to be used in the edge strobe mode or into expected value information to be used in the multi-strobe mode, depending on which of the edge strobe mode and the multi-strobe mode is selected.

13. A method for manufacturing electronic devices, comprising:
   forming the electronic devices;
   testing the electronic devices using the test method according to claim 12, and
   manufacturing the electronic devices by identifying acceptable electronic devices and/or ranking the electronic devices according to electrical characteristics, based on test results for the electronic devices.

* * * * *